United States Patent [19]
Eliashberg et al.

[11] Patent Number: 6,127,834
[45] Date of Patent: Oct. 3, 2000

[54] APPARATUS FOR TESTING AN INTEGRATED CIRCUIT IN AN OVEN DURING BURN-IN

[75] Inventors: Victor M. Eliashberg, Palo Alto; Kombupalayam M. Prakash, Newark, both of Calif.

[73] Assignee: Pycon, Inc., Santa Clara, Calif.

[21] Appl. No.: 09/128,731

[22] Filed: Aug. 4, 1998

Related U.S. Application Data

[62] Division of application No. 08/627,079, Apr. 3, 1996, Pat. No. 5,966,021.

[51] Int. Cl.[7] ............................................. G01R 31/02
[52] U.S. Cl. ............................ 324/760; 324/158.1
[58] Field of Search ........................ 324/760, 158.1, 324/754, 763; 714/733, 734; 219/209

[56] References Cited

U.S. PATENT DOCUMENTS

| | | | |
|---|---|---|---|
| 4,145,620 | 3/1979 | Dice | 307/149 |
| 4,374,317 | 2/1983 | Bradshaw | 219/385 |
| 4,683,424 | 7/1987 | Cutright et al. | 324/158 |
| 4,746,855 | 5/1988 | Wrinn | 324/73 |
| 4,902,969 | 2/1990 | Gussman | 324/158 |
| 4,947,545 | 8/1990 | Gussman | 29/705 |
| 4,956,602 | 9/1990 | Parrish | 324/158 |
| 5,093,982 | 3/1992 | Gussman | 29/705 |
| 5,103,168 | 4/1992 | Fuoco | 324/760 |
| 5,126,656 | 6/1992 | Jones | 324/158 |
| 5,191,282 | 3/1993 | Liken et al. | 324/158 |
| 5,254,839 | 10/1993 | Laine | 219/494 |
| 5,402,078 | 3/1995 | Hamilton | 324/760 |
| 5,420,521 | 5/1995 | Jones | 324/760 |
| 5,429,510 | 7/1995 | Barraclough et al. | 439/59 |
| 5,528,161 | 6/1996 | Liken et al. | 324/760 |
| 5,543,727 | 8/1996 | Bushard et al. | 324/760 |
| 5,796,246 | 8/1998 | Poh et al. | 324/760 |
| 5,880,592 | 3/1999 | Sharpes et al. | 324/760 |

*Primary Examiner*—Ernest Karlsen
*Attorney, Agent, or Firm*—Blakely, Sokoloff, Taylor & Zafman LLP

[57] ABSTRACT

An apparatus for testing an integrated circuit in an oven during burn-in. A burn-in board in the oven is electrically connected to a plurality of integrated circuit ("IC") components. A driver/interface board outside the oven is electrically connected to the burn-in board through a plurality of contacts and sends and receives a plurality of signals between the IC components and a test controller. A switch module on the burn-in board comprises a plurality of high-temperature switches for transferring signals between the plurality of IC components and the driver/interface board during burn-in. A plurality of signals entering the switch module from the driver/interface board does not exceed in number the plurality of contacts, and is fewer in number than a plurality of signals exiting the switch module to the plurality of IC components.

7 Claims, 11 Drawing Sheets

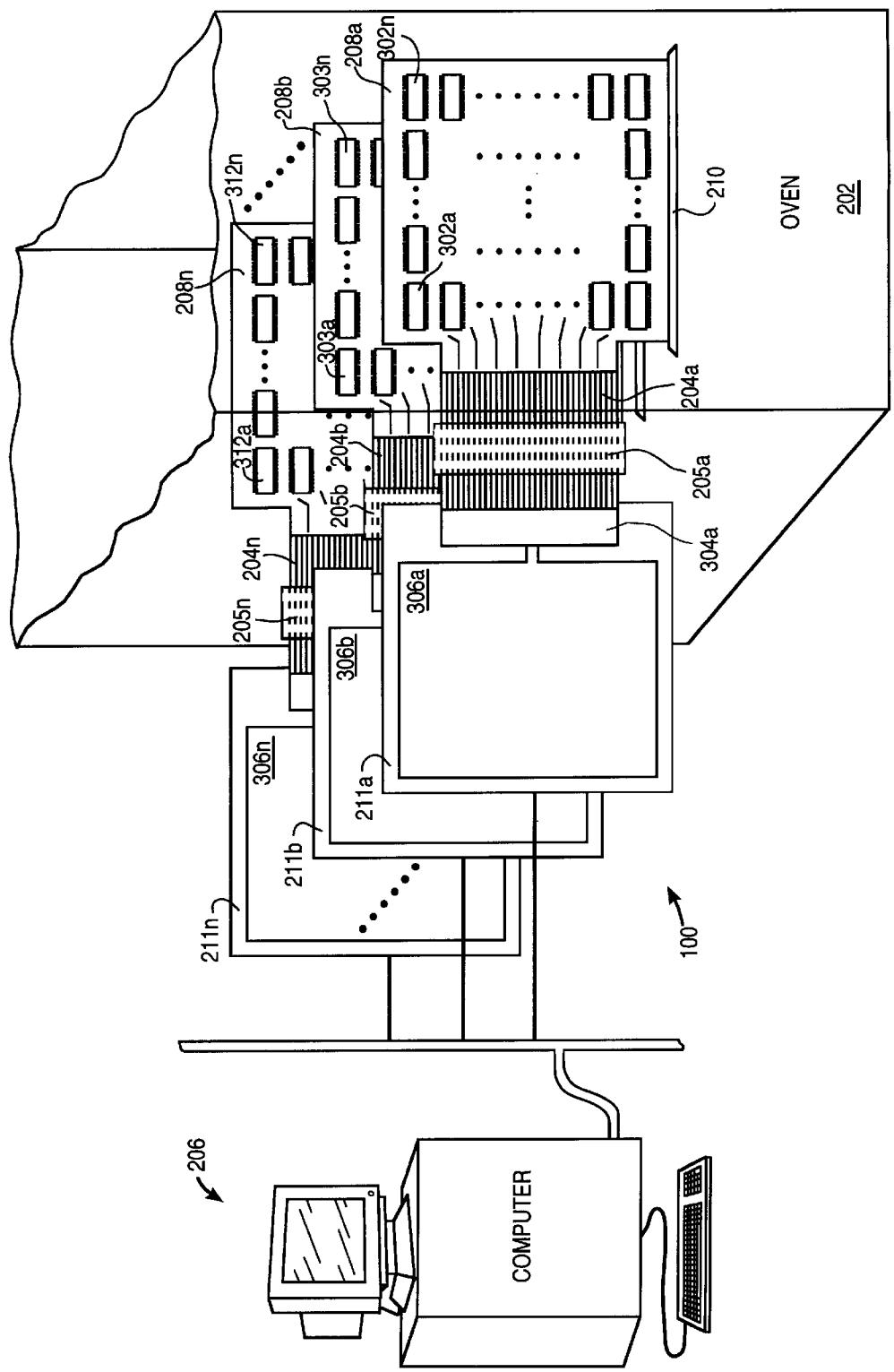
FIG_2 (PRIOR ART)

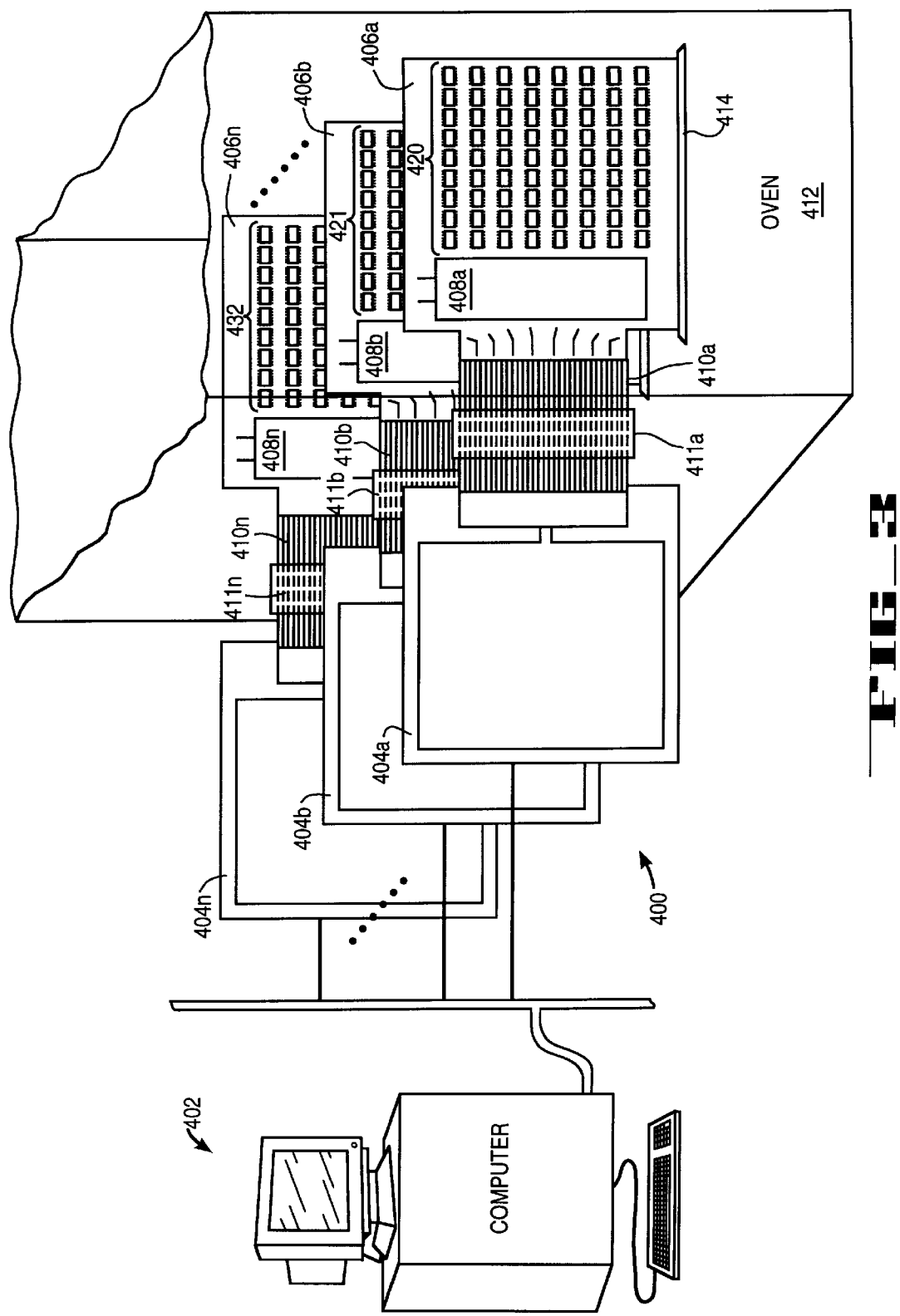
FIG_3

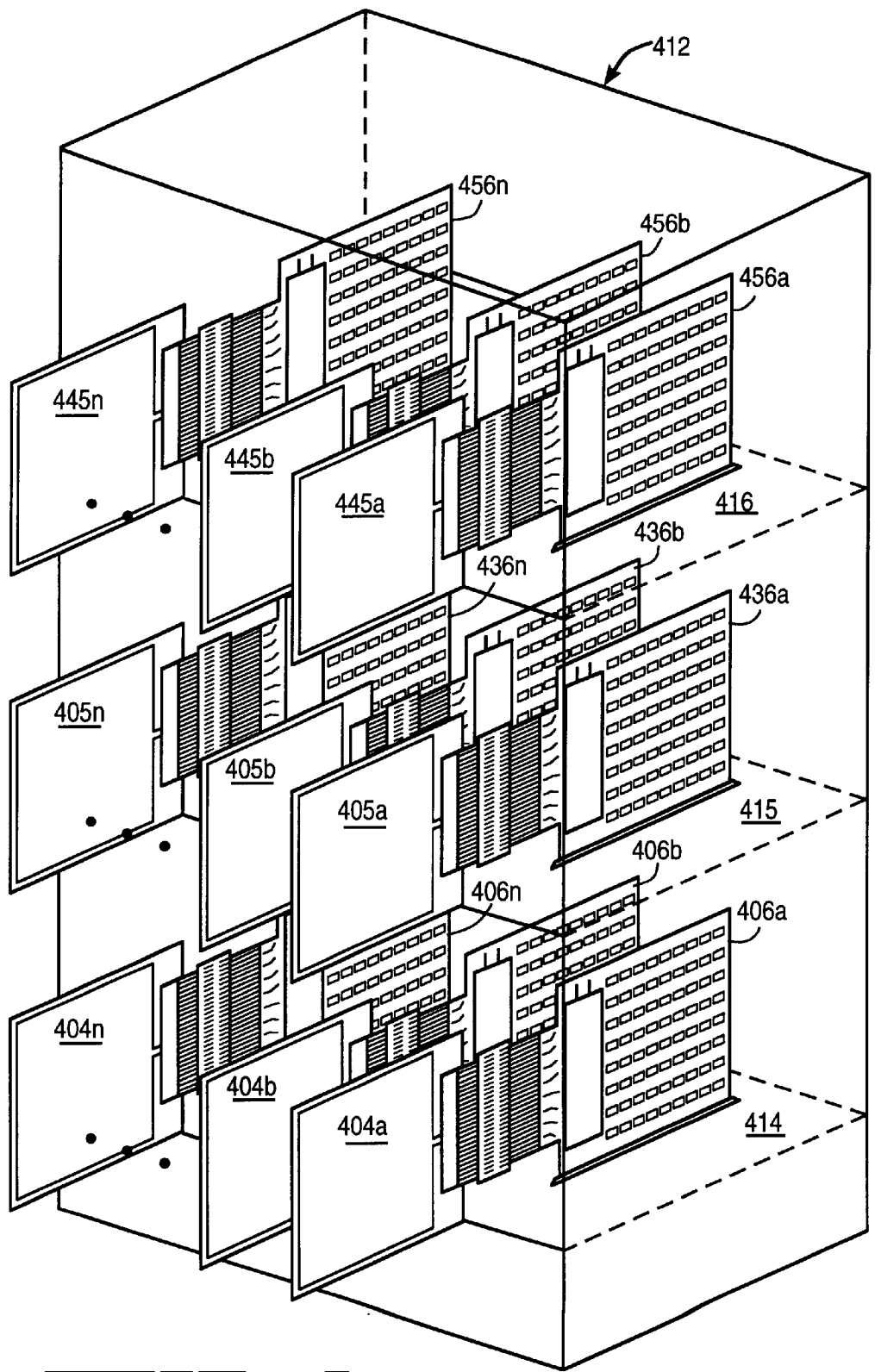
FIG_4

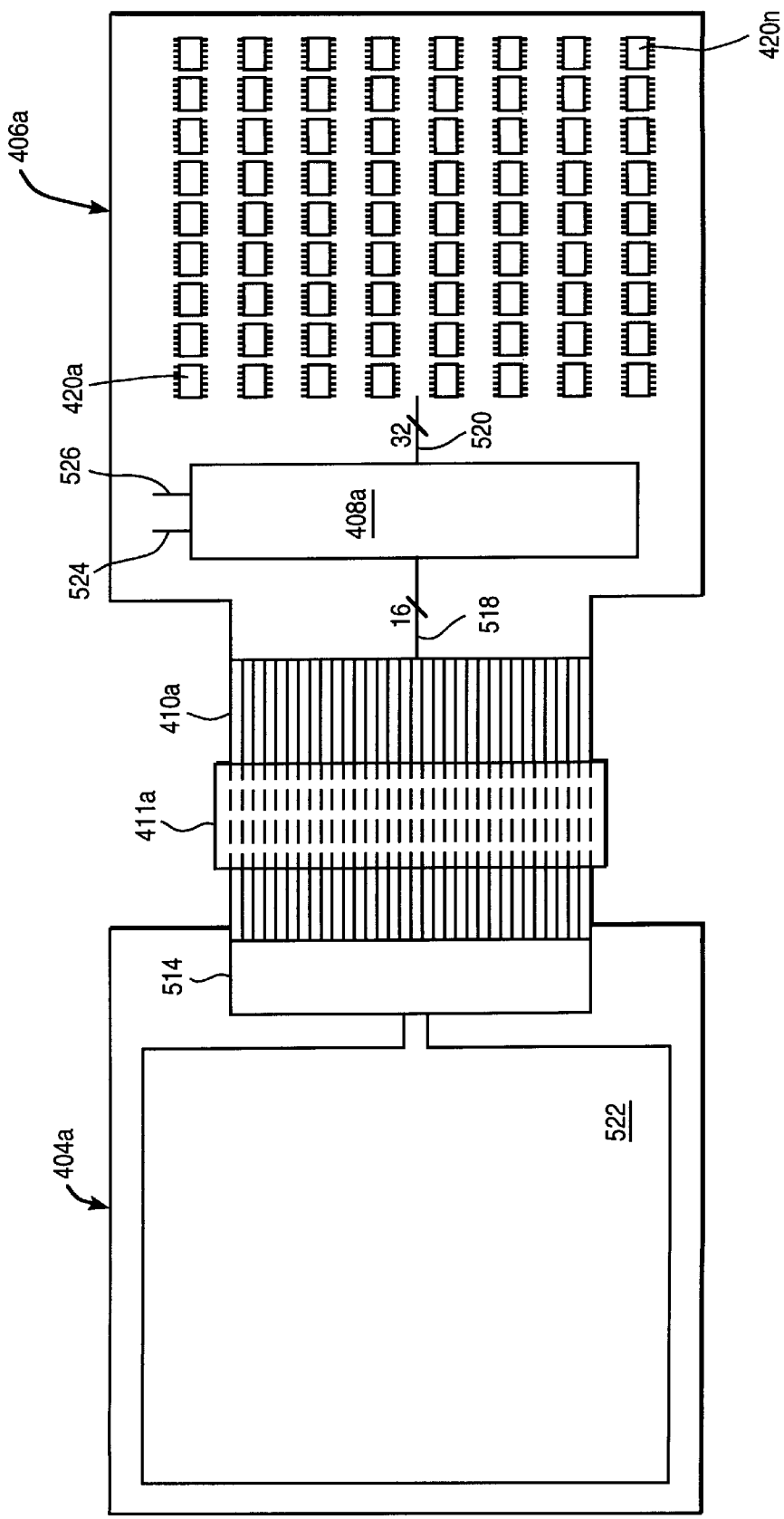
FIG_5

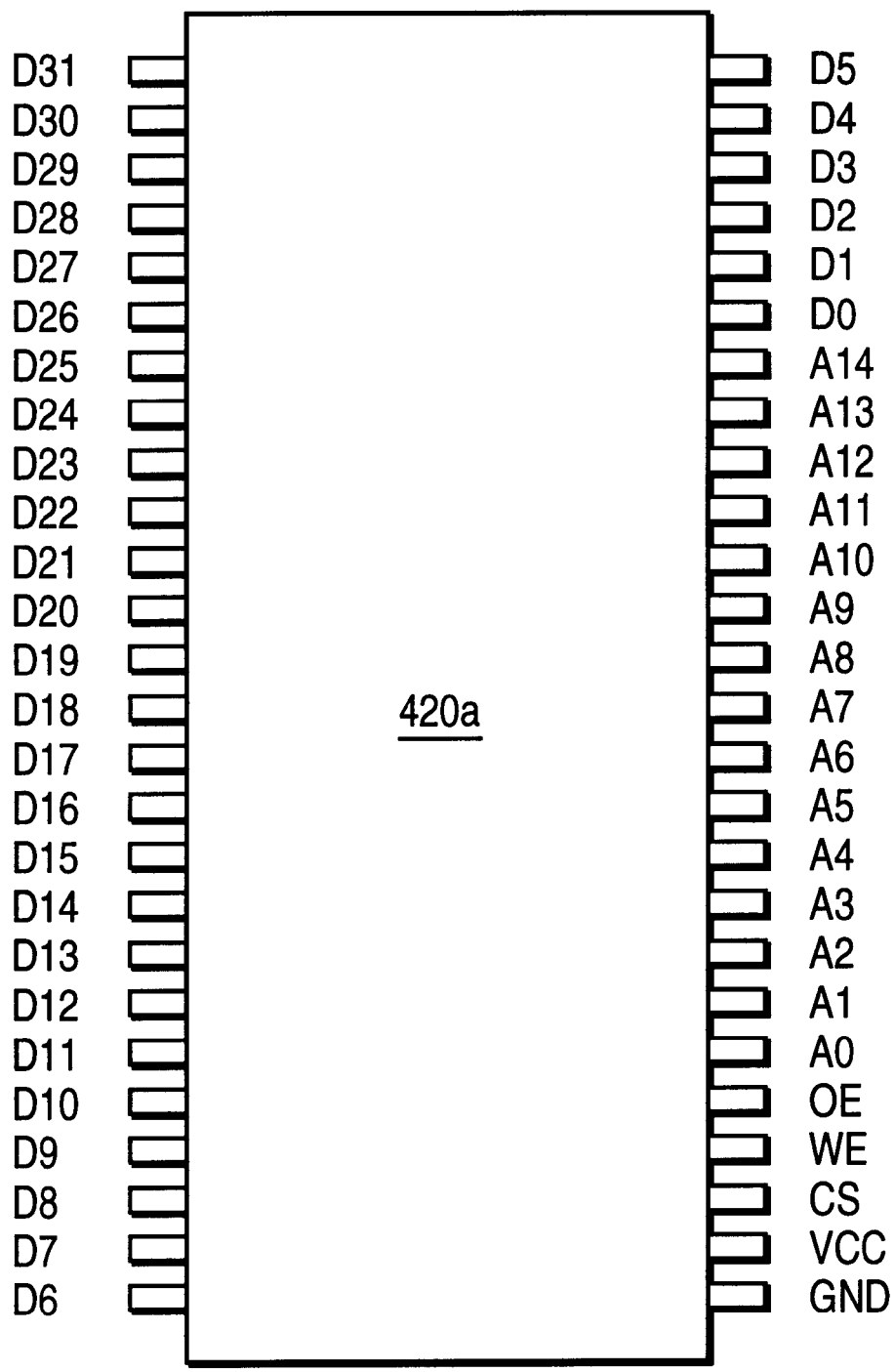
FIG_6

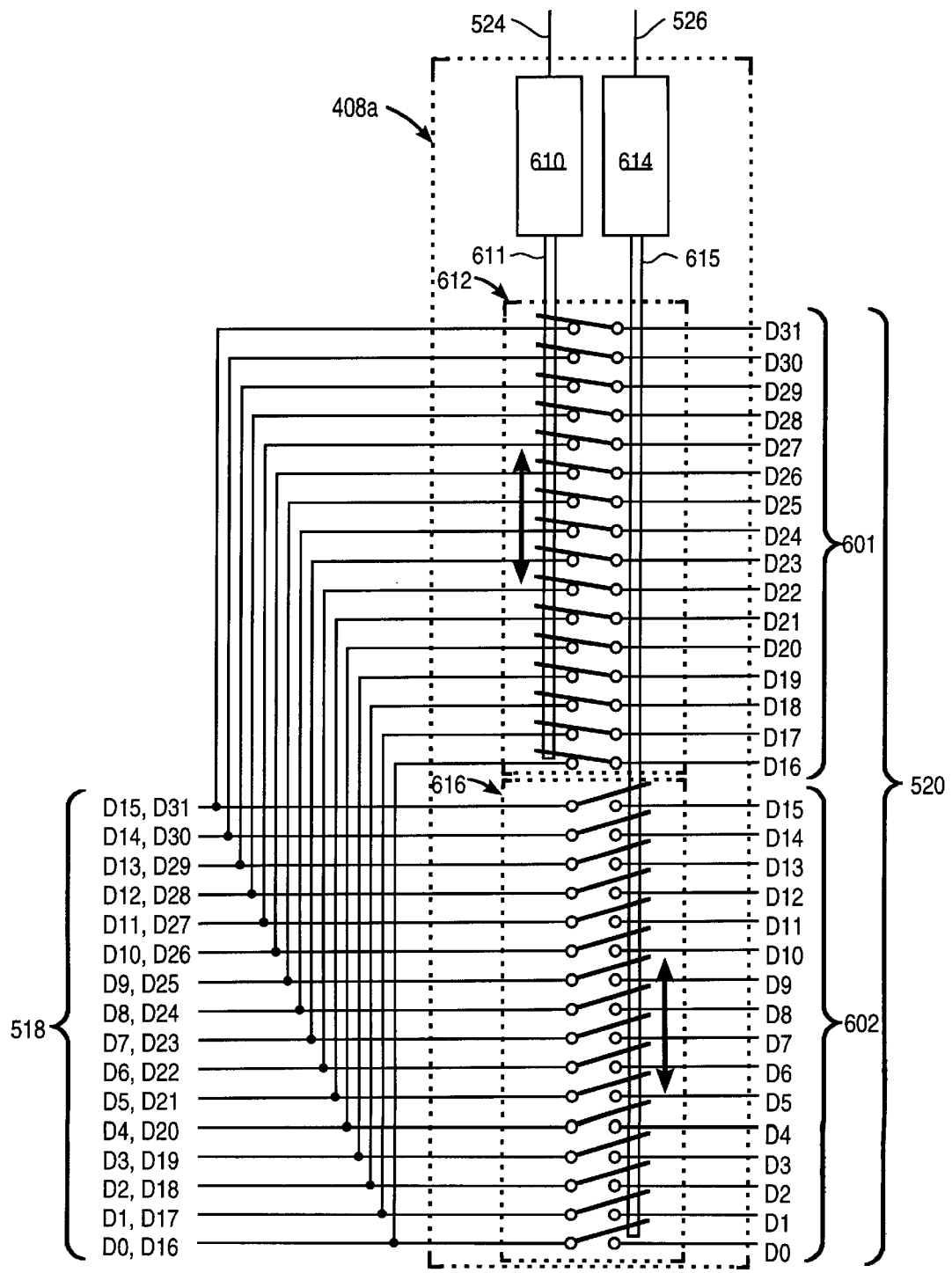
FIG_7

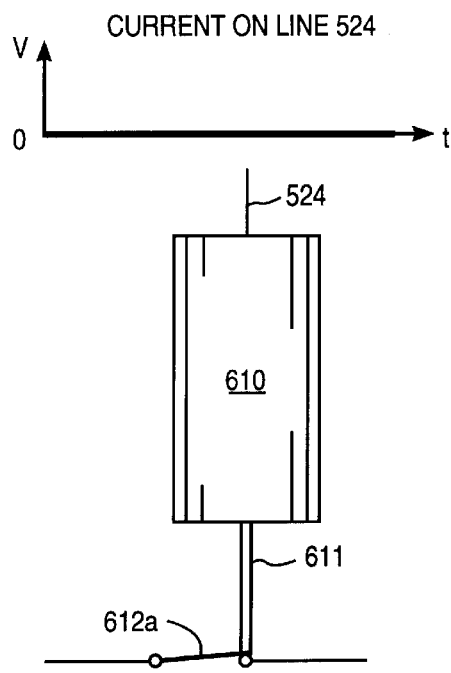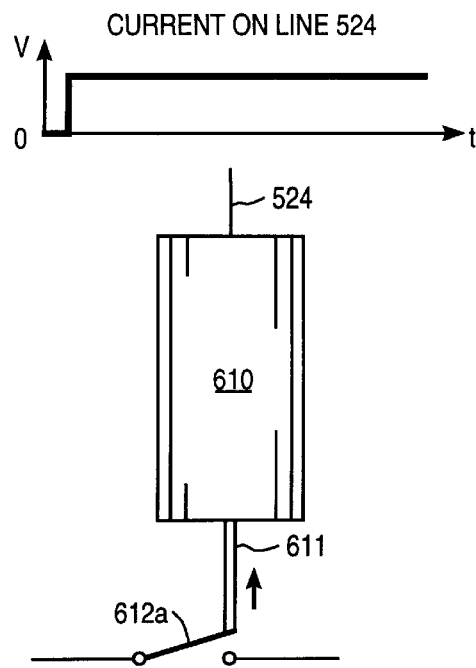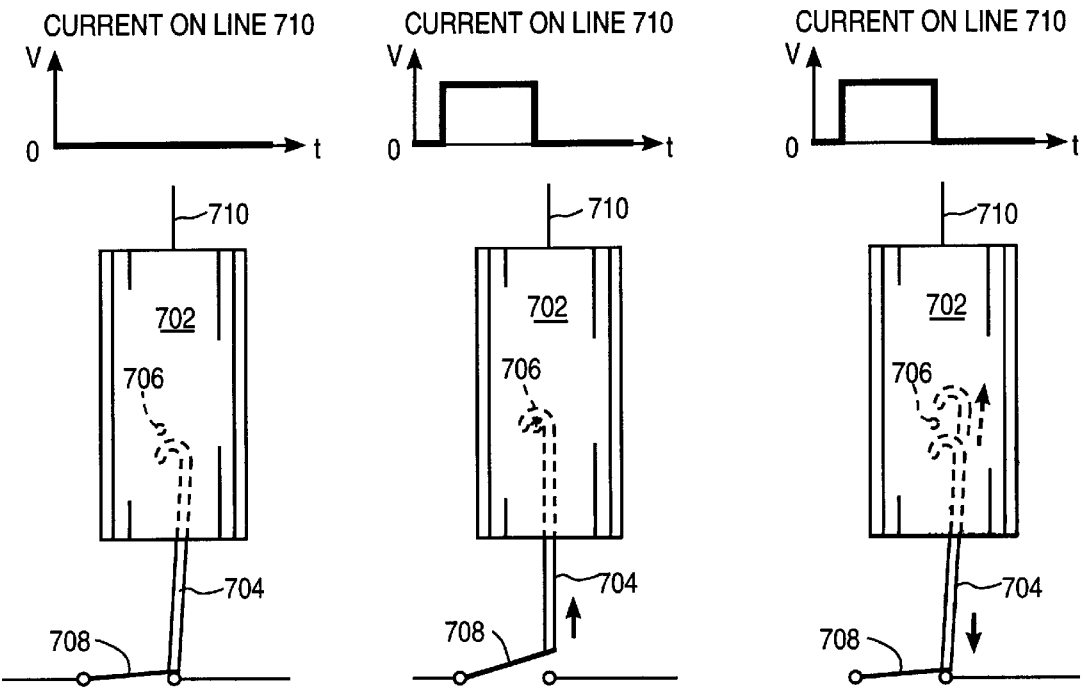

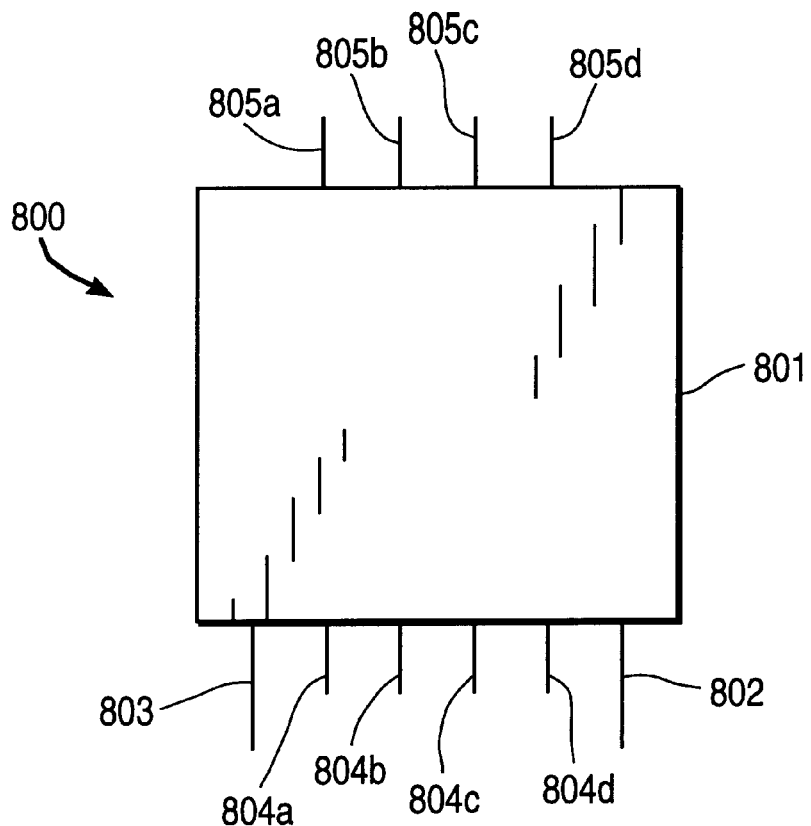
FIG_10A
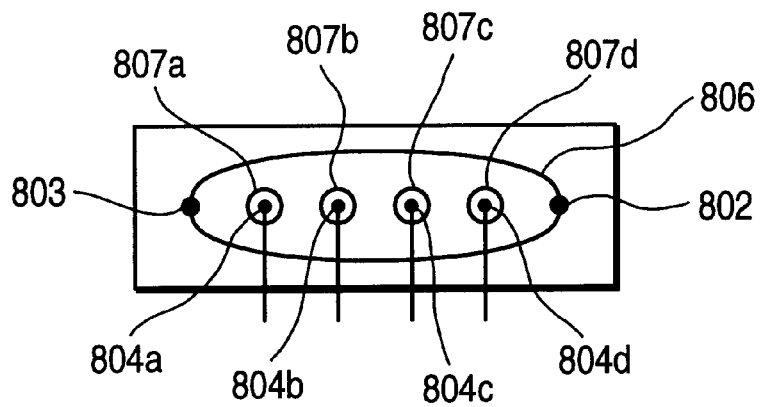
FIG_10B

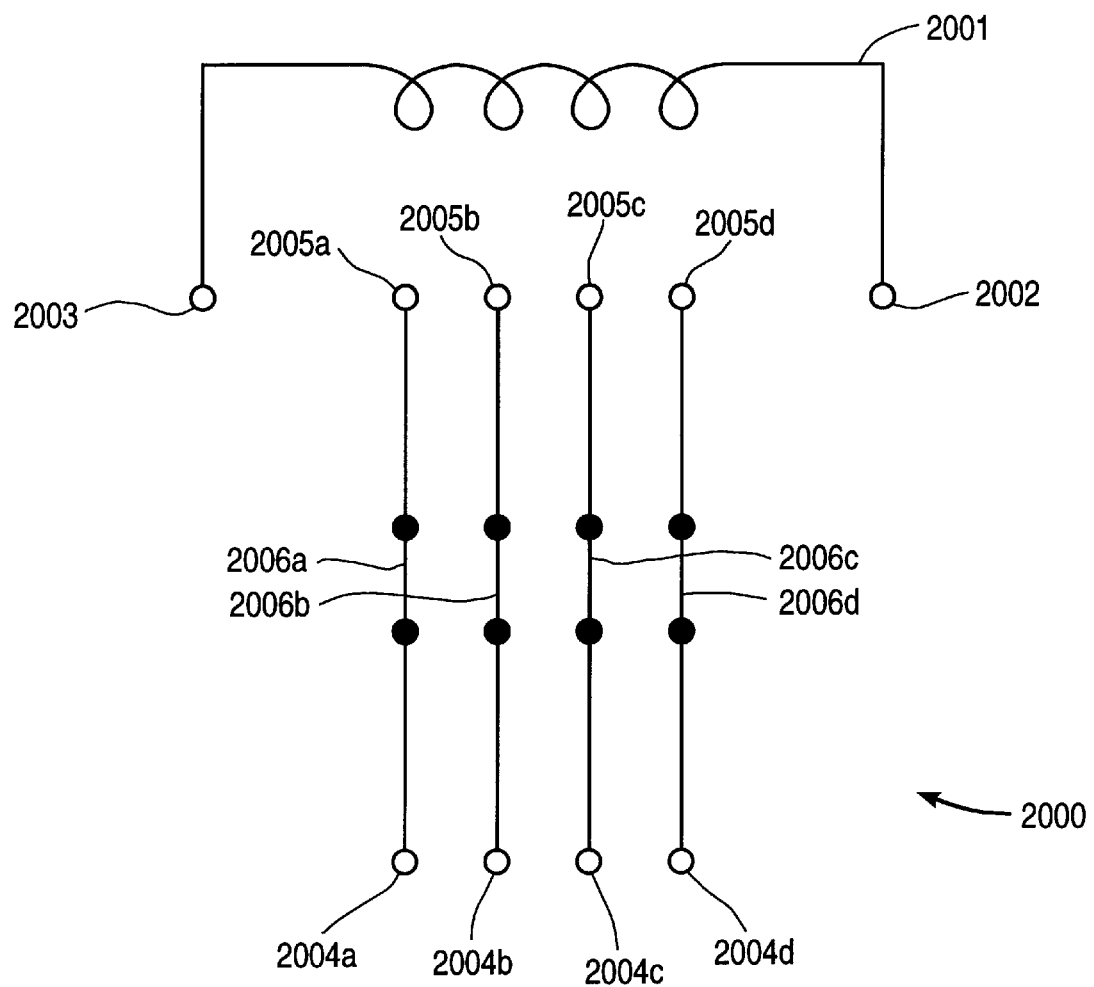
FIG_11

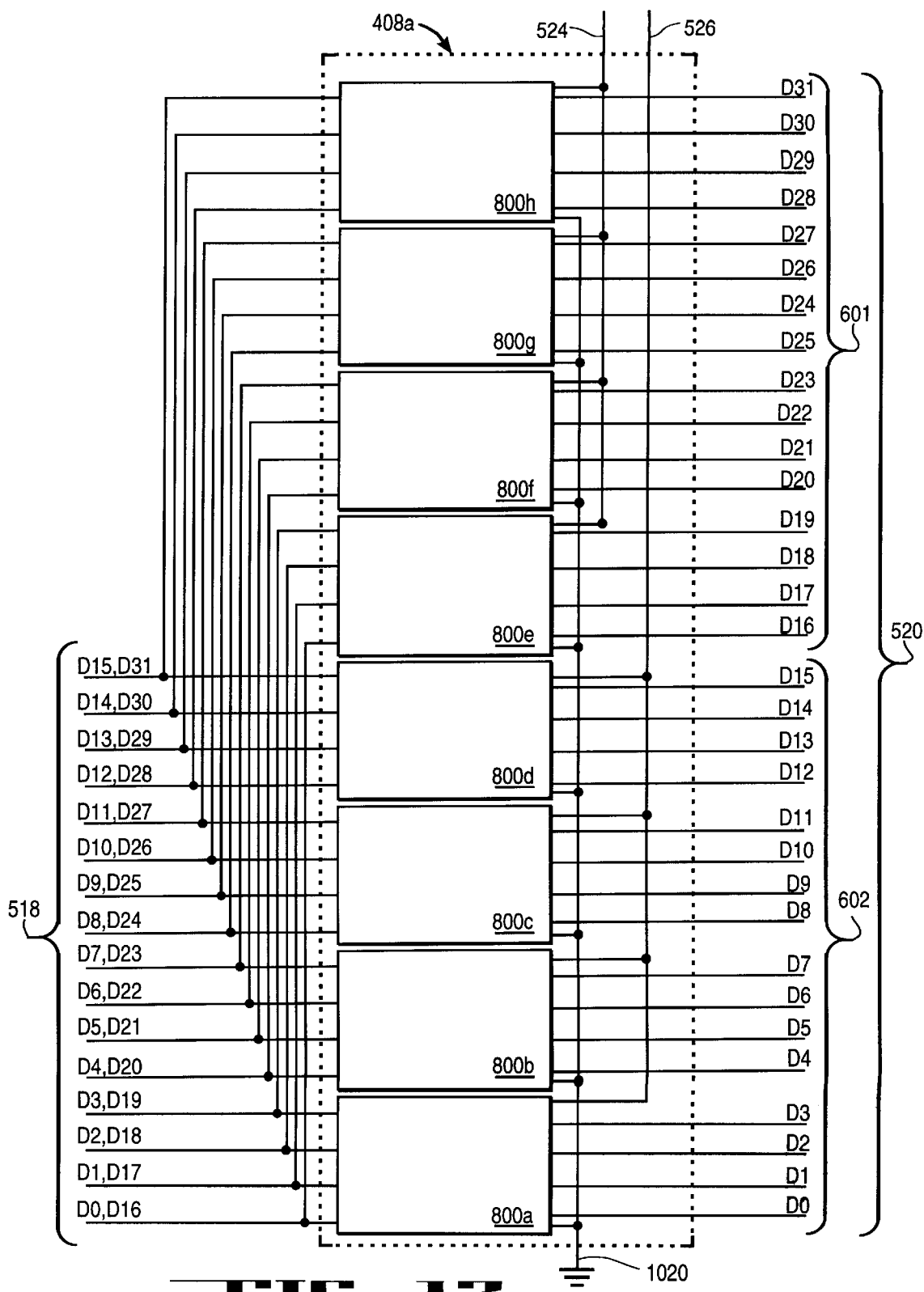
FIG_12

APPARATUS FOR TESTING AN INTEGRATED CIRCUIT IN AN OVEN DURING BURN-IN

This is a Divisional of prior application No. 08/627,079, now U.S. Pat. No. 5,966,021.

FIELD OF THE INVENTION

The present invention relates to the field of testing integrated circuits. More particularly, the present invention relates to testing integrated circuits under high-temperature conditions.

BACKGROUND OF THE INVENTION

Integrated circuits are often tested after manufacture by electrically stressing the devices in an elevated temperature for a period of time to cause failure of marginal devices. This process is referred to as burn-in. Multiple integrated circuit chips are placed on a burn-in board that is similar to a computer add-on card, but usually much larger. The burn-in board is a printed circuit board with receptacles for the integrated circuit chips. The burn-in board also includes printed circuit connections between pins of the integrated circuit chips and connectors of the burn-in board.

FIG. 1 shows a prior integrated circuit testing system 100. Oven 202 encloses multiple burn-in boards, each of which holds multiple integrated circuit ("IC") chips. The burn-in boards (not visible in FIG. 1) inside oven 202 are electrically connected to respective driver/interface boards 211a through 211n, 212a through 212n, and 213a through 213n. Each driver/interface board of driver/interface boards 211a through 211n, 212a through 212n, and 213a through 213n is electrically connected in turn to computer 206. Computer 206 controls the driver/interface boards with software that controls the testing of the integrated circuit chips.

FIG. 2 is a cutaway transparent view of oven 202 showing one row of burn-in boards 208a through 208n secured in one rack 210 within oven 202. For example, seventy-two burn-in boards can be placed in oven 202 at one time through the use of multiple racks at various levels. Other numbers of burn-in boards are possible.

Burn-in boards 208a through 208n have respective male connectors 204a through 204n. Typically, each burn-in board of boards 208a through 208n has seventy-two electrical strip contacts that comprise the male connector. For example, connector 204a has seventy-two contacts, with thirty-six of the contacts on one side of connector 204a and thirty-six of the contacts on the opposite side of connector 204a.

Driver/interface boards 211a through 211n have respective female connectors 205a through 205n. Typically, each driver/interface board of boards 211a through 211n has seventy-two contacts that comprise the female connector. For example, connector 205a has seventy-two contacts, with thirty-six of the contacts on one side of connector 205a and thirty-six of the contacts on the opposite side of connector 205a.

Male connectors 204a through 204n are connected into respective female connectors 205a through 205n and provide electrical pathways between driver/interface boards 211a through 211n and burn-in boards 208a through 208n. Driver/interface boards 211a through 211n are in turn electrically connected to computer 206. Burn-in boards 208a through 208n each include IC chips 302a–n through 312a–n, and those IC chips are accordingly electrically connected to computer 206.

As shown in FIG. 2, multiple integrated circuit chips 302a through 302n are arranged in columns and rows on burn-in board 208a. Each of integrated circuit chips 302a through 302n receives clock, power, and ground signals. Each of integrated circuit chips 302a through 302n is powered during the entire test period. Some of the contacts of connectors 204a and 205a are used for clock, power, and ground signals. This reduces the number of contacts available to carry other signals. For example, typically eight contacts are used on connector 204a to carry clock, power, and ground signals, leaving sixty-four contacts available to carry other signals. The other burn-in boards 208b through 208n have similar configurations. For example, integrated circuit chips 303a through 303n reside on burn-in board 208b, and integrated circuit chips 312a through 312n reside on burn-in board 208n.

For a burn-in board such as burn-in board 208a, the number of IC chips 302a through 302n is limited by the number of contacts of connector 204a and by the number of pins being used on each of the IC chips 302a through 302n under test. Different types of IC chips have different pin-outs.

For instance, an IC chip with sixteen pins and two control signals typically requires fewer signals at any one time than an IC chip with forty-eight pins and four control signals. An IC chip requiring fewer signals at any one time during the burn-in procedure requires the use of fewer contacts of connector 204a at any one time. It follows that burn-in board 208a can accommodate more of those IC chips that require few signals than those IC chips that require many signals. For a memory having a 32-bit data word and $2^{15}$ (i.e., 32 k) address locations, seventy-two of these IC chips can be accommodated on burn-in board 208a. Similarly, seventy-two of these IC chips can be accommodated on each of burn-in boards 208b through 208n.

Driver/interface board 211a includes driver area 304a and logic area 306a. Driver area 304a contains a driver for each contact within connector 205a on the driver/interface board. Logic area 306a contains logic for receiving and processing signals sent from computer 206 to burn-in board 208a. Driver/interface boards 311b through 311n have similar respective driver areas 304b though 304n and logic areas 306b through 306n.

Typically in prior burn-in test systems a computer program causes computer 206 to send signals to the integrated circuit chips 302a–n through 312a–n on respective burn-in boards 208a through 208n via respective driver/interface boards 211a through 211n. The signals toggle various device pins under elevated temperatures for some test period. For example, pins of the IC chips 302a through 302n are sent alternating logic one and logic zero signals—usually 5 volts alternating with zero volts. After some period, typically as long as twenty-four hours, the burn-in board 208a is removed from the oven. The integrated circuit chips 302a through 302n are then removed from the board 208a by hand and placed on an IC electrical tester (not shown) that resides outside of oven 202. The IC electrical tester is a separate external unit designed specifically for determining the functionality of the integrated circuit chips and operates the IC chips at room temperature. If any of the integrated circuit chips 302a through 302n failed during the burn-in process, the failure is discovered typically during various tests after burn-in, and each failed IC chip is discarded. A similar procedure is used for IC chips 303a–n through 312a–n of respective burn-in boards 208b through 208n.

One disadvantage of the prior burn-in test system 100 is the need for extensive testing of IC chips after burn-in to determine whether they have failed. The external testers used for this testing are very expensive, usually costing millions of dollars, and are also expensive to operate. In addition, each test which must be performed by the external testers after burn-in requires more labor and time. For these reasons, it would be very desirable to perform functional tests on IC chips while they are undergoing burn-in.

Because of limitations of prior burn-in test systems, it is not possible to perform many functional tests on IC chips while they are in the oven. For example, for IC chips that are memory devices with data words of thirty-two bits or more, the typical burn-in board and driver/interface board pin configuration of prior burn-in test systems prevents the testing of the memory devices while they are in the oven 202. Because a limited number of pins 204a connect burn-in board 208a with the driver/interface board 211a, not enough pins 204a are available to carry various control signals and address signals at the same time as thirty-two data signals. This can be explained using, for example, a memory with 32-bit wide data words and a $2^{15}$ (i.e., 32 k) address space. Such a memory is typically referred to as a "32 K×32" memory. Fifteen address lines are needed to address the $2^{15}$ address space. Assuming that there is an array of 8 rows and 9 columns of memories under test on a burn-in board, seventeen device select lines are required. Five lines are typically required for control and clock, but the number can vary depending on the particular memory under test. Fifteen address lines plus seventeen device select lines plus five control and clock lines results in a total of thirty-seven lines of that are used out of sixty-four available contacts of connector 204a. Thus, only twenty-seven contacts remain unused, which is not enough to carry thirty-two bits of data to be read from a memory device.

SUMMARY AND OBJECTS OF THE INVENTION

One object of the present invention is to provide a method and apparatus for testing integrated circuits during high-temperature stress testing such as during burn-in.

Another object of the present invention is to reduce the number of tests to be performed using expensive testing equipment after burn-in.

Another object is to allow increased test functionality in a test system with the use of standard burn-in boards and standard driver/interfaces.

An apparatus for testing an integrated circuit in an oven during burn-in is described. A burn-in board in the oven is electrically connected to a plurality of integrated circuit ("IC") components. A driver/interface board outside the oven is electrically connected to the burn-in board through a plurality of contacts and sends and receives a plurality of signals between the IC components and a test controller. A switch module on the burn-in board comprises a plurality of high-temperature switches for transferring signals between the plurality of IC components and the driver/interface board during burn-in. A plurality of signals entering the switch module from the driver/interface board does not exceed in number the plurality of contacts, and is fewer in number than a plurality of signals exiting the switch module to the plurality of IC components.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which

FIG. 2 provides a cutaway transparent view of the prior burn-in test system and shows multiple burn-in boards and driver interface boards;

FIG. 3 is a cutaway transparent view of a multiple burn-in board test system;

FIG. 4 is an orthogonal transparent view of an oven containing burn-in boards connected to driver/interface boards;

FIG. 5 is shows a driver/interface board coupled to a burn-in board with a switch module;

FIG. 6 shows the pins of an integrated circuit memory having a 32-bit wide data word;

FIG. 7 shows an embodiment of a high-temperature switch module of a burn-in board;

FIG. 8A illustrates operation of a solenoid with no current;

FIG. 8B illustrates operation of the solenoid with a constant elevated current;

FIG. 9A illustrates operation of another solenoid without current;

FIG. 9B illustrates operation of the solenoid after one pulse of current;

FIG. 9C illustrates operation of the solenoid after another pulse of current.

FIG. 10A is a top view of a high-temperature four-switch relay;

FIG. 10B is a front view of a high-temperature four-switch relay;

FIG. 11 is an electrical diagrammatic representation of a high-temperature four-switch relay;

FIG. 12 illustrates an embodiment of a high-temperature switch module of a burn-in board.

DETAILED DESCRIPTION

Figure 1:
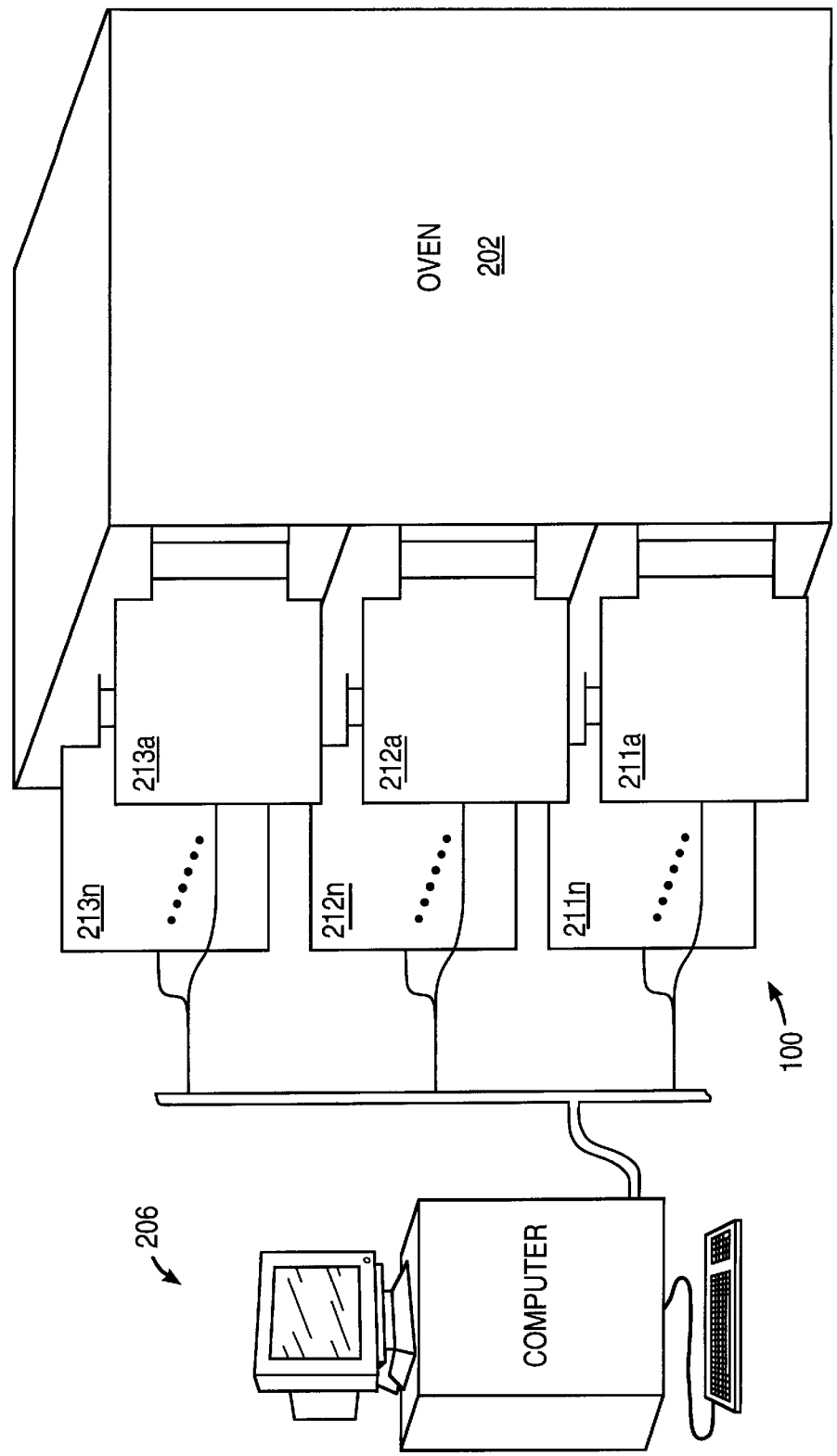
FIG. 1 shows a prior burn-in test system.

An apparatus is described that allows functional testing of integrated circuit ("IC") chips with wide data words during the burn-in process. For one embodiment, the IC chips are IC memories. Embodiments for testing an IC memory with a 32-bit data word will be described. Alternative embodiments allow for functional testing of other IC devices with wider or narrower data words. One embodiment uses a solenoid switch on a burn-in board requiring an increased current level to be applied to the solenoid during solenoid actuation. Another embodiment instead uses high-temperature tolerant relays on the burn-in board. The various embodiments are described in more detail below.

FIG. 3 shows an integrated circuit burn-in test system 400. FIG. 3 shows that test system 400 includes computer 402, oven 412 with rack 414, burn-in boards 406a through 406n, and driver/interface boards 404a through 404n. Memory chips 420 reside on burn-in board 406a, memory chips 421 reside on burn-in board 406b, and memory chips 432 reside on burn-board 406n.

FIG. 3 for illustrative purposes shows a portion of the inside of oven 412 and only shows one rack 414 of burn-in boards 406a through 406n and driver/interface boards 404a through 404n. As shown in FIG. 4, oven 412 actually contains three racks 414, 415, and 416 of burn-in boards and driver/interface boards. Rack 415 holds burn-in boards 436a through 436n coupled to respective driver/interface boards 405a through 405n. Rack 416 holds burn-in boards 456a through 456n coupled to respective driver/interface boards 445a through 445n. Burn-in boards 406a–n, 436a–n, and 456a–n each contain memories under test within oven 412. For one embodiment, "n" equals twelve. For alternative embodiments, there can be a greater or lesser number of racks within oven 412, and "n" can be a greater or lesser number.

Referring to FIG. 3, computer 402 directs the burn-in test of memories 420 through 432 by communicating with driver/interface boards 404a through 404n. Software within computer 402 controls the burn-in test.

Burn-in boards 406a through 406n have respective male connectors 410a through 410n. For one embodiment, each burn-in board or boards 406a through 406n has seventy-two electrical strip contacts that comprise the male connector. For example, connector 410a has thirty-six contacts on one side and thirty-six contacts on the other side, totaling seventy-two contacts.

Driver/interface boards 404a through 404n have respective female connectors 411a through 411n. Each female connector of connectors 411a through 411n has seventy-two contacts—thirty six contacts on each side.

Male connectors 410a through 410n are connected into respective female connectors 411a through 411n and provide electrical pathways between driver/interface boards 404a through 404n and burn-in boards 406a through 406n. Driver/interface boards 404a through 404n are in turn electrically connected to computer 402. Burn-in boards 406a through 406n include memories 420 through 432 that are under the high-temperature test. The memories 420 through 432 are coupled to computer 402 via burn-in boards 406a through 406n and driver/interface 404a through 404n. Driver/interface boards 404a through 404n and burn-in boards 406a through 406n receive power from oven 412.

Burn-in boards 406a through 406n have respective high-temperature switch circuitry 408a through 408n that permits the functional testing of memories 420 through 432 while those memories are being tested under high-temperature within oven 412. Switch 408a, for example, is coupled between memories 420 and male connector 410a on burn-in board 406a. Switches 408b through 408n are similarly connected on their respective burn-in boards. Switches 408a through 408n are controlled by computer 402 via respective driver/interface boards 404a through 404n.

FIG. 5 shows one of the burn-in boards and one of the driver/interface boards of test system 400. FIG. 5 shows burn-in board 406a connected to driver/interface board 404a. Driver/interface board 404a is a printed circuit board that includes logic area 522 and driver area 514. Logic area 522 includes logic required to process signals from a controlling computer 402 and to send resulting signals to burn-in board 406a. Logic area 522 can, for example, include several integrated circuits configured for the logic necessary to perform burn-in testing. The integrated circuits can be off-the-shelf circuits, application specific integrated circuits ("ASICs"), programmable logic devices ("PLDs"), or a combination thereof. Logic area 522 also includes logic to receive and process signals from burn-in board 406a.

All signals entering and leaving driver/interface board 404a are transferred via driver area 514 and pass through female connector 411a. There are seventy-two contacts within female connector 411a (thirty-six on each side of driver/interface board 404a). Those seventy-two contacts are coupled to driver 514 and male connector 410a.

Driver area 514 contains tri-state drivers for signals entering or exiting driver/interface board 404a. When a signal leaves logic area 522, the signal passes through an outgoing driver within driver area 512 and onto burn-in board 406a via connectors 411a and 410a. A corresponding incoming driver within driver area 512 is tri-stated to prevent possible signal collision and component damage. When a signal enters driver/interface board 404a from burn-in board 406a, however, the signal passes through an incoming driver within driver area 512 on the way to logic area 522. The corresponding outgoing driver within driver area 512 is then tri-stated. Logic within logic area 522 controls the states of drivers in driver area 514.

Burn-in board 406a is a printed circuit board made of material capable of withstanding temperatures in excess of 150° Celsius. Burn-in board 406a communicates with driver/interface board 404a through male connector 410a, which has seventy-two contacts. Memories 420 are inserted into receptacles in burn-in board 406a. For this embodiment, memories 420 form an array that has eight rows and nine columns. All memories 420 are identical.

Each memory of memories 420 receives or transmits signals via its device pins through the printed circuits on burn-in board 406a. Seventy-two memories 420 can be tested at one time on burn-in board 406a. Each memory is under power during the entire burn-in process, which can take up to twenty-four hours. Each memory receives power, ground, control, address, and data signals through male connector 410a and through the circuitry of burn-in board 406a. Data signals, representing data to be written to or read from memories 420, pass through switch module 408a. Data lines 518, which are sixteen bits wide, run between switch module 408a and male connector 410a. Data lines 520, which are thirty-two bits wide, run between switch module 408a and memories 420. Other lines carrying power, ground, control, and address signals are not shown in FIG. 5.

Contacts 524 and 526 are the contacts for the solenoids (not shown in FIG. 5) within switch module 408a. Solenoid contacts 524 and 526 receive control signals from circuitry 522 of driver/interface board 404a via driver circuitry 514, female connector 411a, and male connector 410a. As discussed in more detail below, the signals on solenoid contacts 524 and 526 determine how lines 518 are connected to lines 520.

One embodiment of the present invention permits the testing of various 32 K×32 memories. FIG. 6 shows one type of memory 420a, which is a 32 K×32 IDT71V432 cache memory sold by Integrated Device Technology, Inc. of Santa Clara, Calif., and which is one of memories 420.

Pins D0 through D31 are thirty-two pins for transferring data signals to be written to or read from memory 420a. Pins A0 through A14 are fifteen address pins for transferring address signals indicating an address location among $2^{15}$ address locations to be written to or read from. Pin OE is an output enable pin transferring a signal that enables the memory to be read from. Pin WE is a write enable pin transferring a signal allowing the memory device to be written to. Pin CS is a chip select pin. If pin CS does not have an active signal, no operation can take place in the memory. Pin Vcc is a power pin. Pin GND is a ground pin.

Each memory of memories 420 has a positive voltage on pin Vcc during the entire burn-in period. Each memory of memories 420 receives fifteen address signals sent by driver/interface board 404a via female connector 411a and male connector 410a. In this manner, each of memories 420 on burn-in board 406a receives the same address on its address pins A0 through A14. Only one of the memories 420 on burn-in board 406a, however, is written to or read from at any one time during the burn-in period. The memory of memories 420 to be written to or read from is chosen by its unique row and column address in the array of memories 420. This is accomplished by using, for example, nine connectors of male connector 410a to transfer nine chip select signals. Each of the nine chip select signals goes to a CS pin of each memory in one column of the array of memories 420. Eight connectors of male connector 410a are then used to transfer eight output enable signals. Each of the output enable signals goes to an OE pin of each memory in one row of the array of memories 420. Finally, eight connectors of male connector 410a are then used to transfer eight write enable signals. Each of the write enable signals goes to a WE pin of each memory in one row of the array of memories 420. In this way it is possible to select one device at a time for either reading or writing. Device selection and operation are determined by the software running on controlling computer 402. Driver/interface logic 522 receives and routes signals from computer 402 to burn-in board 406a through connectors 411a and 410a.

After connectors of male connector 410a are allotted for addressing, power, ground, and chip select/control, there are not thirty-two connectors of male connector 410a remaining for thirty-two data signals for memories with 32-bit wide data words. Nevertheless, switch module 408a shown in FIG. 5 permits sixteen data signals to be routed to 32-bit data word memories 420 in such a way that it is possible during burn-in to both write to a unique 32-bit data word memory and read from the same memory. This permits during burn-in both functional testing and testing for device failure. Switch module 408a receives two switch signals via solenoid contacts 524 and 526. The switch signals originate from controlling computer 402 running burn-in test software and are processed and routed by logic in logic area 522 of driver/interface board 404a.

FIG. 7 shows an embodiment of switch module 408a and shows data lines 518 and 520 coupled to switch module 408a. Data lines 520 are made up of data lines 601 for data bits D16 through D31 plus data lines 602 for data bits D0 through D15.

Solenoid 610 within switch module 408a is connected to and controls switches 612. Switches 612 are connected on the right side to data lines 601 and on the left side to data lines 518. Solenoid 610 is controlled by current appearing on line 524. Solenoid 614 within switch module 408a is connected to and controls switches 616. Switches 614 are connected on the right side to data lines 602 and on the left side to data lines 518. Solenoid 614 is controlled by current appearing on line 526. Solenoids 610 and 614, as well as switches 612 and 616, are capable of withstanding temperatures in excess of 150° Celsius.

When current is present on line 524, the current flows through a coil within solenoid 610. The current in the coil creates a magnetic force causing rod 611 of solenoid 610 to move upward, opening switches 612. Rod 611 is attached to each contact of switches 612. FIG. 7 shows switches 612 in the normally closed position, which is the position that occurs when no current is applied to line 524. Similarly, when current is present on line 526, switches 616 are opened by rod 615. FIG. 7 shows switches 616 in the open position, which is the position that occurs when current is applied to line 526.

Data lines 518 enter switch module 600, and depending on the status of switches 612 and 616, can either (1) connect with data lines 601, (2) connect with data lines 602, or (3) connect with both data lines 601 and data lines 602. Switches 612 when closed transfer sixteen data bits D16 through D31, which are the upper bits of the a 32-bit data word. Switches 616 when closed transfer sixteen data bits D0 through D15, which are the lower bits of a 32-bit data word. Lines 518 can transfer sixteen data bits D0 through D15 or D16 through D31, depending upon the state of switches 612 and 616, which in turn is dependent upon whether respective solenoids 610 and 614 are energized (i.e., actuated).

For a write operation during burn-in, a memory is selected from the array of memories 420 on burn-in board 408a using chip select and write enable signals. Data is written to the address location of the selected memory of memories 420, which is indicated by address signals carried to the memory through connectors 411a and 410a from driver/interface board 404a to burn-in board 406a. During the write operation, there is no current on either of the solenoid lines 524 and 526. Switches 612 and 616 are closed, causing the data on data lines 518 to pass to both data lines 601 and data lines 602. The upper sixteen bits of the 32-bit data word written to the indicated address location of the selected memory will match the lower sixteen bits of the 32-bit data word because data lines 518 feed both data lines 601 and 602.

In a read operation during burn-in, a memory is selected from memories 420 on burn-in board using chip select and output enable signals. A read operation involves reading in turn the upper sixteen bits of the 32-bit data word and then the lower sixteen bits of the 32-bit data word. During the reading of the upper sixteen bits (i.e., bits D16 through D31), there is no current through solenoid line contact 524, but there is current flowing into solenoid line 526. This results in switches 612 being closed and switches 616 being open. This is the state shown in FIG. 7 of switch module 408a. Signals on data lines 601 pass through to data lines 518 and are transferred to driver/interface board 404a for transfer to controlling computer 402. During the reading of the lower sixteen bits (i.e., bits D0 through D15), there is no current through solenoid contact 526, but there is a current on solenoid contact 524. Accordingly, switches 616 are closed and switches 612 are open. Signals on data lines 602 pass to data lines 518 and are transferred to driver/interface board 404a for transfer to controlling computer 402.

Computer 402 determines whether the data read out of the memory matches the data written to the same location within the memory. If the data does not match, or the memory fails to produce any data on a read operation, the computer 402 indicates to the user that the memory has failed.

A greater number of functional tests can thus be performed during burn-in, and a greater number of failed memories identified without the need to remove the memories from oven 412. The time required for testing using a separate, external tester to test the memories after burn-in for failure is reduced, thus potentially reducing the number of external testers required to achieve the same testing throughput. Labor required for operating external testers is also reduced. Switch module 408a permits memory testing using burn-in boards and driver/interface boards with the standard number of respective male and female contacts. The use of switch module 408a permits functional testing during burn-in of memories having 32-bit wide or wider data words.

FIGS. 8A and 8B illustrate the different positions of rod 611 and switch 612a (one of the switches of switches 612) resulting from different currents being applied to solenoid 610 via line 524.

As shown in FIG. 8A, zero current on line 524 means that no current flows through an internal coil (not shown) of solenoid 610. Accordingly, solenoid 610 is not activated, rod 611 remains in an outward position in relation to solenoid 610, and switch 612a remains in its normally closed position. The spring force from switch 612a pulls rod 611 into this outward position.

As shown in FIG. 8B, an elevated constant current on line 524 means that current flows through the internal coil (not shown) of solenoid 610. Solenoid 610 is accordingly activated, which causes rod 611 to be pulled inward towards solenoid 610. The pulling of rod 611 inward in turn opens switch 612a. Reducing the current on line 524 to zero would, however, cause rod cell to move outward from the spring force of switch 612a, and switch 612a would close.

FIGS. 9A, 9B, and 9C show an alternative embodiment that uses a solenoid 702 that has a J-shaped rod 704 and a latch 706 within solenoid 702. FIG. 9A shows the starting state with no current on line 710 running into solenoid 702. Rod 704 is not latched and switch 708 remains in a normally closed position. The spring force from switch 708 pulls rod 704 outward. As shown in FIG. 9B, applying a pulse of current to line 710 causes rod 704 to move inward with respect to solenoid 702, and rod 704 becomes securely latched into latch 706 because of the J-shaped end of rod 704. Switch 708 accordingly is opened and remains opened. As shown in FIG. 9C, applying another pulse of current sequentially in time to line 710 causes rod 704 to initially move slightly upward, which releases rod 704 from latch 706. After the pulse of current returns to zero, the spring force from switch 708 pulls rod 704 outward in relation to solenoid 702 and switch 708 closes. For the embodiment of FIGS. 9A, 9B, and 9C, less power is used because it is not necessary to apply a constant current to solenoid line 710 for the entire period required to accomplish a write or read operation with respect to a memory device. In addition, solenoid 702 remains cooler, given that the heat accumulation associated with constantly applying current does not occur.

Other embodiments employ other heat tolerant devices in place of solenoids 610 and 614 of FIG. 7. For example, FIG. 10A shows a top view of a heat tolerant four-switch relay 800.

Relay 800 is a relay supplied by Computer Components, Inc. of East Granby, Conn. Relay 800 can withstand high temperatures, such as those within burn-in oven 412. Relay 800 was developed and designed by Computer Components, Inc. of East Granby, Conn. The design of relay 800 is not part of the present invention.

Relay 800 is a "normally closed" relay. That is, the switches of relay 800 are closed unless power is applied to the relay. For an alternative embodiment, "normally open" relays are used. Housing 801 is of heat tolerant material. Winding terminals 802 and 803 are connected to opposite ends of the relay winding. One of winding terminals 802 and 803 is connected to a positive voltage during operation, while the other is connected to ground. Device pin/switch contacts 804a through 804d each provide pins for insertion into standard electrical printed circuit boards and allow connection to one side of a switch. Device pin/switch contacts 805a through 805d each provide pins for insertion into standard electrical printed circuit boards and allow connection to the opposite side of a corresponding switch. For example device pin/switch contact 804a and device pin/switch contact 805a are opposite contacts of the same switch.

FIG. 10B shows a front view of relay 800. Device pin/switch contacts 804a through 804d are shown surrounded by insulating sheathing 807a through 807d. Winding wire 806 is shown surrounding device pin/switch contacts 804a through 804d and connecting to winding terminals 802 and 803.

FIG. 11 is an electrical diagram 2000 of relay 800. Winding 2001 and winding terminals 2002 and 2003 are shown. Switch terminal 2004a through 2004d are connected to corresponding switch terminals 2005a through 2005d by switch mechanisms 2006a through 2006d.

FIG. 12 shows an embodiment of switch module 408a using relays, and shows data lines 518 and 520 coupled to switch module 408a. Data lines 520 are made up of data lines 601 for data bits D16 through D31 plus data lines 602 for data bits D0 through D15. Relays 800a through 800h are similar to relays 800.

Relays 800a through 800d are connected between data lines 518 and 602. Relays 800e through 800h are connected between data lines 518 and 601. Relays 800a through 800h are connected to ground 1020 through one winding terminal. The remaining winding terminal of relays 800a through 800d is connected to line 526. The remaining winding terminal of relays 800e through 800h is connected to line 524. Each of relays 800a through 800h is connected so as to provide switching capability for four sets of data lines. For example relay 800a connects data line D0, D16 of data lines 518 to data line D0 of data lines 602 through one of its four switches. Similarly, another switch of relay 800a connects data line D1, D17 of data lines 518 to data line D1 of data lines 602. Another switch of relay 800a connects data line D2, D18 of data lines 518 to data line D2 of data lines 602. The final switch of relay 800a connects data line D3, D19 of data lines 518 to data line D3 of data lines 602.

When current is present on line 524, the switches of relays 800e through 800h are opened, breaking the electrical connection between data lines 518 and data lines 601. Similarly, when current is present on line 526, the switches of relays 800a through 800d are opened, breaking the electrical connection between data lines 518 and data lines 602. In this way, switch module 408a operates as described with reference to FIG. 7.

Alternative embodiments also permit testing of various types integrated circuits with pin counts greater or less than fifty-two. These alternative embodiments can accommodate more or fewer integrated circuits on a standard burn-in board having seventy-two pins, depending upon the signal needs of the device under test.

Alternative embodiments are envisioned that use other high-temperature switches in place of relays or solenoids.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for testing an integrated circuit in an oven during burn-in comprising:
   a burn-in board in the oven electrically connected to a plurality of integrated circuit ("IC") components designed to perform certain functions;
   a driver/interface board outside the oven for sending and receiving a plurality of signals between the IC components and a test controller, the driver/interface board electrically connected to the burn-in board through a plurality of contacts;

a switch module on the burn-in board comprising a plurality of switches capable of operating at temperatures in excess of 150 degrees Celsius for transferring signals between the plurality of IC components and the driver/interface board during burn-in, the plurality of switches coupled between the driver/interface board and the plurality of IC components so that a plurality of signals entering the switch module from the driver/interface board cause the IC components to perform at least one of the functions, the plurality of signals entering the switch module from the driver/interface board not exceeding in number the plurality of contacts, and a plurality of signals exiting the switch module exceeding in number the plurality of contacts for simultaneously signaling a number of IC components that is greater than the number of contacts.

2. The apparatus of claim 1, wherein the plurality of high-temperature switches comprise a solenoid coupled to a plurality of switches via an actuator.

3. The apparatus of claim 1, wherein each of the plurality of high-temperature switches is a relay.

4. The apparatus of claim 1, wherein each of the plurality of IC components is programmable.

5. The apparatus of claim 1, wherein each of the plurality of IC components is an application specific integrated circuit ("ASIC").

6. The apparatus of claim 1, wherein the plurality of signals entering the switch module number half the plurality of signals exiting the switch module.

7. The apparatus of claim 6, wherein each of the plurality of IC components is a memory, and wherein the plurality of signals entering and exiting the switch module comprise data signals.

* * * * *